United States Patent [19]

Olson

[11] Patent Number: 5,268,059

[45] Date of Patent: Dec. 7, 1993

[54] DETAPING MACHINE FOR REMOVAL OF INTEGRATED CIRCUIT DEVICES FROM SEALED POCKET TAPE

[75] Inventor: David Olson, Tempe, Ariz.

[73] Assignee: VLSI Technology, Inc., San Jose, Calif.

[21] Appl. No.: 939,215

[22] Filed: Sep. 2, 1992

[51] Int. Cl.⁵ ............................................. B65H 5/28
[52] U.S. Cl. ................... 156/584; 156/344; 221/25; 221/72; 221/82; 414/405
[58] Field of Search .................. 156/584, 344; 221/25, 221/71, 72, 82; 226/5, 8, 52, 120; 414/405, 411

[56] References Cited

U.S. PATENT DOCUMENTS

| | | | |
|---|---|---|---|
| 4,660,282 | 4/1987 | Pfaff | 221/73 X |
| 4,738,386 | 4/1988 | Itemadani et al. | 156/584 X |
| 4,915,770 | 4/1990 | Haeda et al. | 156/584 X |
| 5,148,969 | 9/1992 | Boucher et al. | 156/584 X |
| 5,213,653 | 5/1993 | Akuhori et al. | 156/584 |

Primary Examiner—David A. Simmons
Assistant Examiner—Mark A. Osele
Attorney, Agent, or Firm—LaValle D. Ptak

[57] ABSTRACT

A detaping machine is provided for removing parts from a reel of sealed pocket tape, with minimum handling of such parts. The machine has a spindle on which the sealed pocket tape is mounted. The pocket tape includes a carrier tape portion and a cover tape portion. The carrier tape is fed into the detaping machine in an inverted position; and it is guided on an upper track of the machine. The cover tape is wound on a take-up reel located beneath the upper track. As the cover tape is wound, the carrier tape is driven on the upper track between guide flanges. An aperture is located in the upper track, and it is sized to permit devices, located in the inverted pockets of the carrier tape, to drop through to a second guide track located beneath the aperture. The devices in the second guide track then may be repackaged in carrier tubes or the like, without damaging the leads and without manual handling.

18 Claims, 2 Drawing Sheets

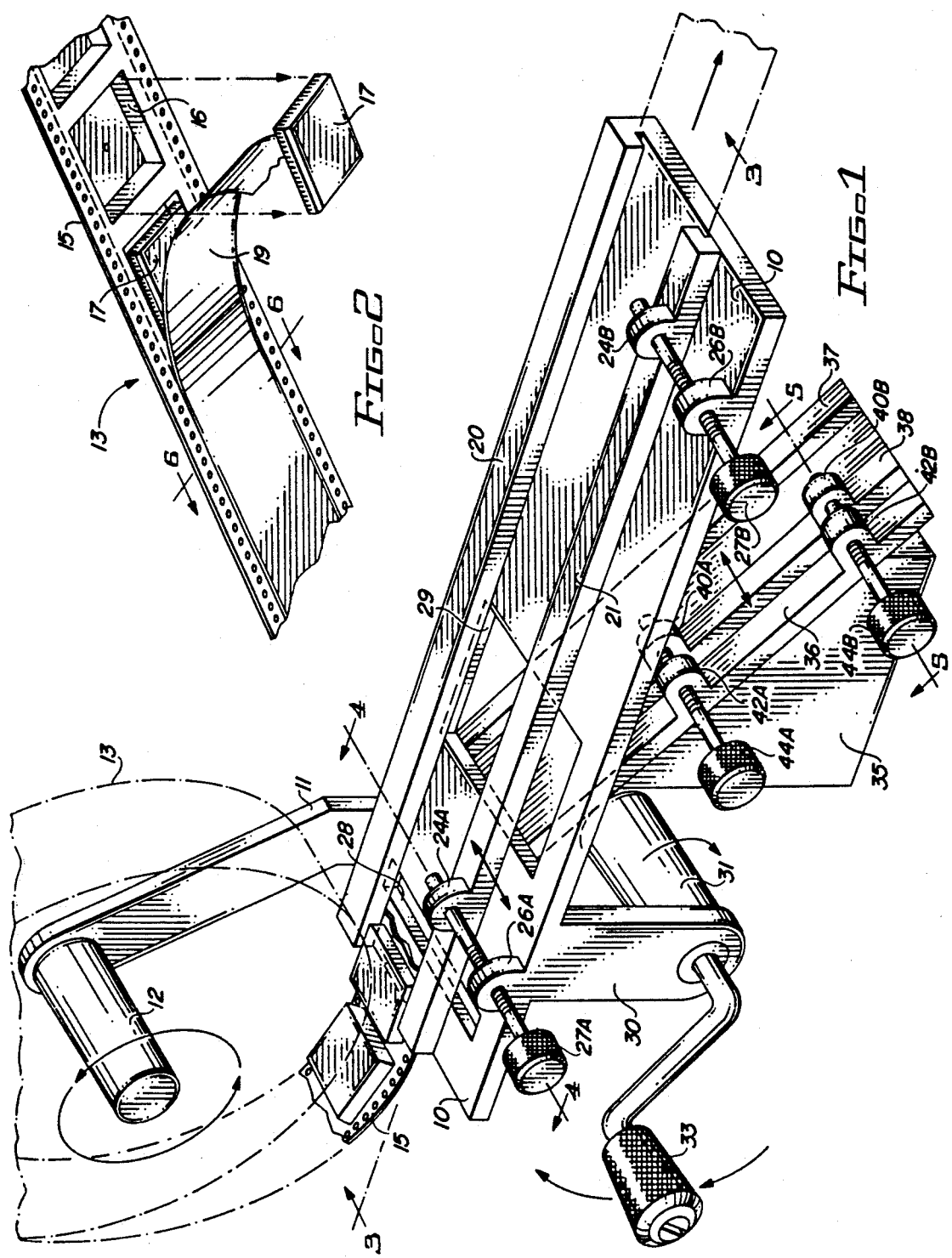

DETAPING MACHINE FOR REMOVAL OF INTEGRATED CIRCUIT DEVICES FROM SEALED POCKET TAPE

BACKGROUND

In the manufacture of large-scale integrated circuit devices, it is necessary to package the devices in a way which minimizes handling, and which minimizes potential damage to the devices, particularly to the leads. In addition, since most large-scale integrated circuit devices are fabricated from CMOS circuitry, the packaging is made of materials which substantially minimize or eliminate static electricity.

For customers requiring large numbers of identical devices, the integrated circuit devices frequently are packaged in elongated strips of sealed "pocket tape". Such pocket tape comprises a carrier tape made of a flexible plastic material, in which a series of adjacent pockets are formed. The pocket size is selected to accommodate correspondingly-sized integrated circuit packages, with one package being placed in each pocket. The pockets are arranged in tandem throughout the length of the carrier tape, which also typically includes perforated flanges along each edge of the tape for utilization in indexing machines where the devices subsequently are removed from the carrier tape.

At the manufacturer of the devices, the carrier tape is moved along; and the devices are inserted into it, and then a cover tape is releasably sealed to the carrier tape along the edges of the different pockets, to hold the devices in the pockets. After this is done, the sealed pocket tape is rolled up on reels for delivery.

On occasion, it is necessary to remove the integrated circuit devices from a sealed pocket tape and to re-package these devices in elongated tubes or other packages. In the past, when this was required, it was necessary to remove the cover tape by hand and to physically handle each of the integrated circuit devices, one at a time, to re-package them. This is a slow and labor intensive procedure, and subjects the fragile integrated circuit packages to possible damage to the leads on the packages.

It is desirable to build a detaping machine, which can quickly and effectively remove integrated circuit devices from a sealed pocket tape, and insert such devices into tubes or other packages without damaging the leads and without labor intensive efforts.

SUMMARY OF THE INVENTION

It is an object of this invention to provide an improved detaping machine for removing devices from a sealed pocket tape.

It is another object of the invention to provide an improved manual detaping machine.

It is an additional object of this invention to provide an improved detaping machine which automatically removes devices from a sealed pocket tape, without requiring manual handling of such devices.

It is a further object of this invention to provide an improved detaping machine for removing integrated circuit devices from a sealed pocket tape, which strips the cover tape from the carrier tape of the pocket tape assembly and moves the carrier tape in an inverted position along a track member from which the devices are sequentially removed by means of gravity, without manual handling.

In accordance with a preferred embodiment of the invention, a detaping machine is provided with a spindle on which a reel of sealed pocket tape is placed. The sealed pocket tape then is fed from the reel, and the cover tape is stripped from the carrier tape and is rolled up on a take-up reel. The carrier tape of the pocket tape assembly is guided through a channel in inverted position; and it is moved by the winding of the cover tape on the cover tape take-up reel. An aperture in the channel is sized to permit the devices carried in the pockets of the carrier tape to drop through the hole and slide down a second track for re-packaging.

BRIEF DESCRIPTION OF THE DRAWINGS

FIG. 1 is a perspective view of a preferred embodiment of the invention;

FIG. 2 is a detail of a feature illustrating the manner of operation of the device of FIG. 1;

DETAILED DESCRIPTION

Figure 3:
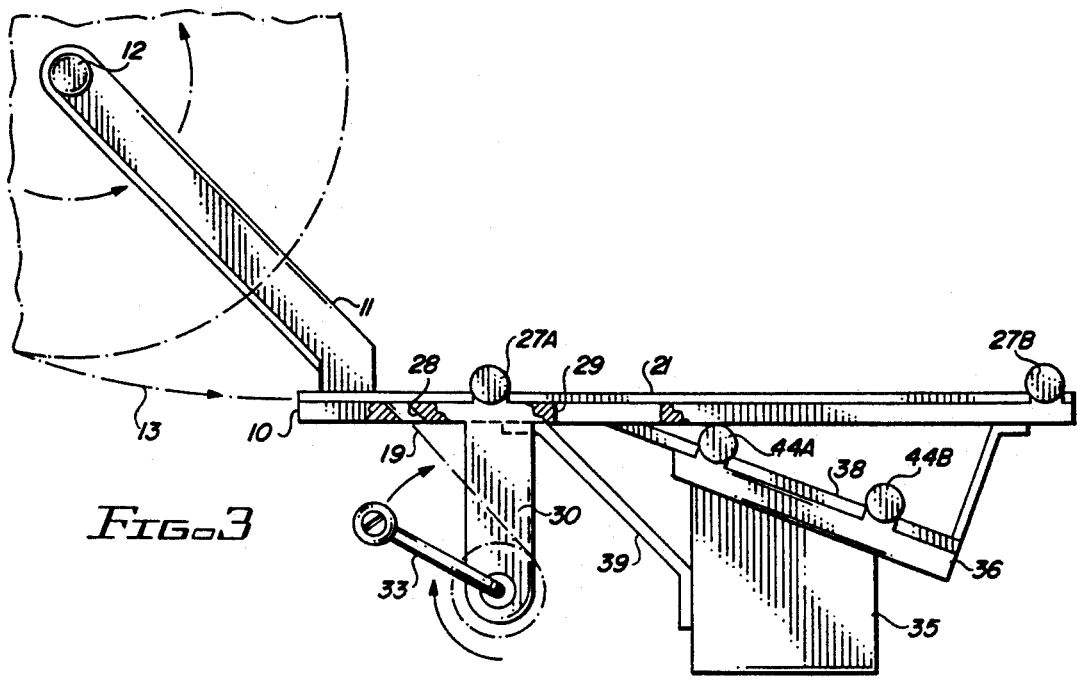
FIG. 3 is a side view of the device of FIG. 1.

Reference now should be made to the drawings, in which the same components have the same reference numbers throughout the different figures. As illustrated in FIGS. 1 and 3, the detaping machine includes a platform or plate 10, which has an upwardly extending reel holder arm 11, with a hub or spindle 12 extending from the arm 11 over the plane of the upper surface of the plate 10.

A reel of sealed pocket tape 13 is placed on the hub 12 for the detaping process. FIG. 2 shows details of the construction of the tape 13 for such a pocket tape. Typically, the tape includes a carrier tape 15, which has a series of longitudinally arranged pockets 16 formed in it. The tape 15 is of a flexible plastic material capable of being rolled onto a reel, while maintaining the shape of the pockets into which integrated circuit packages 17 are placed for storage and shipping. The pockets 16 have an outer dimension chosen to accommodate the outer dimensions of the packages 17 placed in them, and have a depth which is equal to or slightly greater than the thickness of the packages 17 to be carried by the tape.

The carrier tape 15 has perforated outer flanges on each side of the tape, adjacent the pockets 16, as shown most clearly in FIG. 2. Finally, when the integrated circuit packages 17 are inserted in the pockets, the carrier tape 15 is sealed with a relatively thin flexible cover tape 19, again illustrated most clearly in FIG. 2. The pocket tape 13, illustrated in FIG. 2, is a standard package for large-scale integrated circuit devices 17 in widespread use today.

As mentioned previously, occasions arise when it is necessary to remove the integrated circuit devices 17 from the pockets 16 of the carrier tape 15, and re-package them or transport them to a utilization device. To do this, the cover tape 19 must be removed from the carrier tape 15 overlying the pockets 16, from which the integrated circuit devices 17 are to be removed. The device of FIG. 1 is designed so that the packages 17 may be removed without physically handling them in any way.

Figure 4:
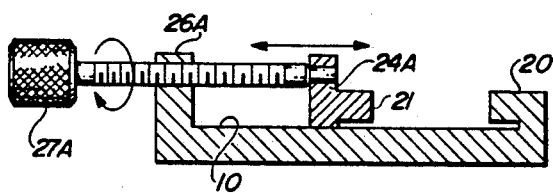
FIG. 4 is a cross-sectional view taken along the line 4—4 of FIG. 1.
Figure 7:
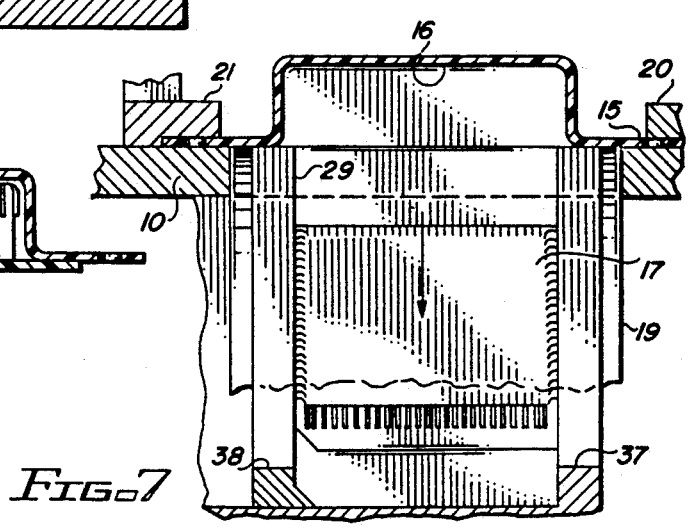
FIG. 7 illustrates details of a part of the embodiment shown in FIG. 1.

A roll of sealed pocket tape 13 is placed on the hub 12 as described. The edges of the carrier tape 15 are aligned between a pair of flanges 20 and 21 extending above the top surface of the plate 10 to form an upper guide track for the edges of the carrier tape 15. As illustrated in FIGS. 1, 4 and 7, the flanges 20 and 21 are undercut at the surface of the plate 10; so that the perforated edges of the carrier tape 15 extend into these undercut areas to hold the carrier tape 15 against the upper surface of the plate 10 and to guide it in the channel formed between the flanges 20 and 21.

To initiate the detaping of the carrier tape 15, so that the packages 17 may be removed, the cover tape 19 initially is peeled off of the end of the roll of sealed pocket tape 13, and is extended through a slot 28 formed through the plate 10 near the left hand edge, as viewed in FIGS. 1 and 3. The cover tape 19 then is wound on a take-up reel 31, mounted on a downwardly extending flange 30, in the direction of the arrows shown in FIGS. 1 and 3 by a crank 33 to pull the sealed pocket tape 13 in the direction of the arrows shown in FIG. 3. This operation unwinds and strips the cover tape 19 from the roll of pocket tape and takes it up on the take-up reel 31.

As the cover tape 19 is wound up on the reel 31, it pulls the composite sealed pocket tape 13 from the reel 12 in the direction of the arrows shown in FIGS. 1 and 3 and pushes the carrier tape portion 15 along the surface of the plate 10. Since the cover tape 19 is removed at the slot 28, continued movement of the carrier tape with the inverted pockets 16, causes the parts 17, located within the pockets 16, to slide along the surface of the plate 10 until the parts 17 reach an aperture 29. At this position, the parts 17 drop out of the pockets 16, as illustrated in FIGS. 2 and 7. The now empty carrier tape 15 continues beyond the aperture 29 to the end of the detaping machine, and is removed from the detaping machine from the right-hand end, as viewed in FIGS. 1 and 3. Typically, this empty carrier tape 15 is discarded in any suitable manner after it leaves the machine.

Integrated circuit devices 17 of different physical sizes are packaged in pocket tapes 13 of different widths, depending upon the dimensions of the devices 17 which are so packaged. To accommodate carrier tapes 15 of different widths, the flange 21 is mounted so that it is movable relative to the flange 20 in accordance with the width of the carrier tape 15 which is to be accommodated. This movement is accomplished by means of a pair of thumbscrews 27A and 27B, which are journaled through threaded shoulders 26A and 26B to engage a pair of upstanding ears 24A and 24B, respectively, for adjusting the channel width. Once the width has been set for any given sealed pocket tape assembly 13, it does not need to be subsequently adjusted. The aperture 29 in the platform 10 has a width which extends substantially across the full width of the platform; so that it is as wide as the widest of the devices 17 which may be carried on any carrier tape 15, used in conjunction with the detaping machine.

As illustrated in FIGS. 1 and 3, the plate 10 is supported on a base 35 by means of a support 39, and by means of a second plate 36, which has a lower track formed in it between a pair of spaced-apart parallel flanges 37 and 38. The flange 38 is movable relative to the flange 37 by means of a pair of thumbscrews 44A and 4B, operating through threaded shoulders 42A and 42B and upright ears 40A and 40B, to move the flange 38 back-and-forth in the direction of the arrows shown in FIGS. 1 and 5 to change the width of the channel between the flanges 37 and 38.

Figure 5:
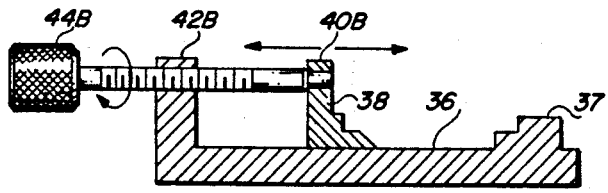
FIG. 5 is a cross-sectional view taken along the line 5—5 in FIG. 1.
Figure 6:
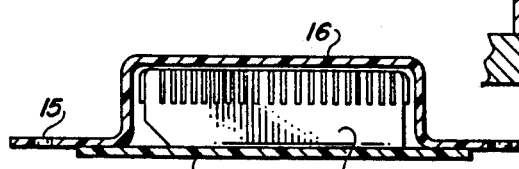
FIG. 6 is a cross section taken along the line 6—6 of FIG. 2.

As illustrated in the cross-sectional view of FIG. 5, the cross-sectional configuration of the flanges 37 and 38 is configured to accommodate the shape of the top of the inverted integrated circuit packages 17 between them. The flanges 37 and 38 are stepped in cross-sectional configuration; so that the leads on the packages 17 do not engage any part of the flanges as the packages slide down the inclined lower track formed on the surface of the plate 36 to exit from the track at the lower end. Although not illustrated in any of the figures of this application, a suitable receptacle, such as a tube for holding and storing several integrated circuit packages 17, may be attached to the exit end of the plate 37 between the flanges 37 and 38.

The manner in which the integrated circuit packages 17 drop from the inverted open pockets 16 through the aperture 29 and slide downwardly on the surface of the plate 36 of the lower track, is illustrated in the end view of FIG. 7, which is taken across the aperture 29. The relative orientation of the various parts at this position in the machine is clearly shown in this figure.

The foregoing description of the preferred embodiment of the invention is to be considered as illustrative of the invention, and not as limiting It is apparent that the adjustment of the flanges 21 and the 38 to cause the channels between these flanges and the corresponding flanges 20 and 37 provides a capability of using the machine with sealed pocket tapes of various widths, without requiring any modifications to the machine or its operation. Although the machine has been illustrated as operated by a hand crank, electrical or pneumatic automatic operation could be employed, if desired. The particular materials, out of which the machine is manufactured, may be varied so long as those materials do not damage the integrated circuit packages 17, physically or electrically. Although a specific thumbscrew operation for changing the width of the channels is indicated, the channel widths also may be changed by means of spring-loaded detent devices or by means of electrically indexed mechanisms, if desired. Other modifications and changes will occur to those skilled in the art, without departing from the true scope of the invention as defined in the appended claims.

I claim:

1. A detaping machine for removing devices from a sealed pocket tape in the form of a carrier tape having pockets for holding such devices and a cover tape sealing the pockets, said detaping machine including in combination:

a base member having an upper track with first and second ends, and having tape holding means mounted adjacent the first end thereof for holding a reel of sealed pocket tape;

guide means on said upper track for guiding the carrier tape of a pocket tape in an inverted position from the first end to the second end of the upper track of said base member;

cover tape take-up means positioned below the upper track of said base member for receiving cover tape removed from a reel of sealed pocket tape;

means for operating said cover tape take-up reel to pull cover tape off the carrier tape of a sealed pocket tape, and to move such carrier tape, after removal of the cover tape, along said guide means; and a device aperture in said upper track for permitting devices in the pockets of a carrier tape from which the cover tape has been removed to drop therethrough from inverted pockets as the carrier tape is moved through said guide means on said upper track.

2. The combination according to claim 1 further including means located beneath the device aperture in said upper track of said base member for receiving devices passing therethrough.

3. The combination according to claim 2 wherein said guide means comprises first and second parallel spaced-apart flanges for guiding the edges of a carrier tape moving therebetween.

4. The combination according to claim 3 wherein said first and second flanges have inwardly turned edges for overlying the respective edges of a carrier tape passing therebetween.

5. The combination according to claim 4 further including means for adjusting the distance between said first and second flanges.

6. The combination according to claim 5 wherein said adjusting means comprise means for moving one of said first and second flanges with respect to the other to change the distance between said first and second flanges to accommodate carrier tapes of different widths.

7. The combination according to claim 6 further including a cover tape aperture through said upper track of said base member located in a position between said cover tape take-up means and said pocket tape reel for permitting passage of cover tape therethrough, as said cover tape is stripped from said carrier tape by said means for operating said cover tape take-up means.

8. The combination according to claim 7 wherein said cover tape take-up means comprises a take-up reel; and said means for operating said cover tape take-up means comprises a means for rotating said take-up reel to strip said cover tape from the carrier tape.

9. The combination according to claim 8 wherein said means for operating said cover tape take-up reel comprises a hand crack, such that winding of said cover tape on said take-up reel as said cover tape is stripped from said pocket tape causes said carrier tape to be driven through said guide means at a speed determined by speed of rotation of the cover tape take-up reel.

10. The combination according to claim 9 wherein said means for receiving the devices passing through the device aperture in the upper track of said base member comprises a lower track having guide means thereon for guiding such devices in a predetermined orientation.

11. The combination according to claim 1 wherein said cover tape take-up means comprises a take-up reel; and said means for operating said cover tape take-up means comprises a means for rotating said take-up reel to strip said cover tape from the carrier tape.

12. The combination according to claim 11 further including a cover tape aperture through said upper track of said base member located in a position between said cover tape take-up means and said pocket tape reel for permitting passage of cover tape therethrough, as said cover tape is stripped from said carrier tape by said means for operating said cover tape take-up means.

13. The combination according to claim 12 wherein said means for operating said cover tape take-up reel comprises a hand crack, such that winding of said cover tape on said take-up reel as said cover tape is stripped from said pocket tape causes said carrier tape to be driven through said guide means at a speed determined by speed of rotation of the cover tape take-up reel.

14. The combination according to claim 1 wherein said guide means comprises first and second parallel spaced-apart flanges for guiding the edges of a carrier tape moving therebetween.

15. The combination according to claim 14 wherein said first and second flanges have inwardly turned edges for overlying the respective edges of a carrier tape passing therebetween.

16. The combination according to claim 15 further including means for adjusting the distance between said first and second flanges.

17. The combination according to claim 16 wherein said adjusting means comprise means for moving one of said first and second flanges with respect to the other to change the distance between said first and second flanges to accommodate carrier tapes of different widths.

18. The combination according to claim 2 wherein said means for receiving the devices passing through the device aperture in the upper track of said base member comprises a lower track having guide means thereon for guiding such devices in a predetermined orientation.

* * * * *